United States Patent
Carta et al.

(10) Patent No.: US 9,472,403 B2
(45) Date of Patent: *Oct. 18, 2016

(54) POWER SEMICONDUCTOR SWITCH WITH PLURALITY OF TRENCHES

(75) Inventors: Rossano Carta, Turin (IT); Laura Bellemo, Turin (IT); Giovanni Richieri, Turin (IT); Luigi Merlin, Turin (IT)

(73) Assignee: SILICONIX TECHNOLOGY C.V., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/946,787

(22) Filed: Nov. 15, 2010

(65) Prior Publication Data

US 2011/0278591 A1    Nov. 17, 2011

Related U.S. Application Data

(63) Continuation of application No. 11/368,979, filed on Mar. 6, 2006, now Pat. No. 7,834,376.

(60) Provisional application No. 60/658,565, filed on Mar. 4, 2005.

(51) Int. Cl.
| | |
|---|---|
| *H01L 29/66* | (2006.01) |
| *H01L 21/04* | (2006.01) |
| *H01L 29/06* | (2006.01) |
| *H01L 29/10* | (2006.01) |
| *H01L 29/808* | (2006.01) |

(52) U.S. Cl.
CPC ......... *H01L 21/047* (2013.01); *H01L 29/0657* (2013.01); *H01L 29/1066* (2013.01); *H01L 29/66068* (2013.01); *H01L 29/8083* (2013.01)

(58) Field of Classification Search
CPC ............... H01L 29/1608; H01L 29/66068; H01L 29/78; H01L 29/41766; H01L 29/45
USPC ............ 257/134, 135, 77, E29.265, E29.242
See application file for complete search history.

(56) References Cited

U.S. PATENT DOCUMENTS

| | | | |
|---|---|---|---|
| 4,036,672 A * | 7/1977 | Kobayashi | ............... 438/192 |
| 4,206,540 A | 6/1980 | Gould | |
| 4,648,175 A | 3/1987 | Metz, Jr. et al. | |
| 4,796,084 A | 1/1989 | Kamasaki et al. | |
| 4,862,244 A | 8/1989 | Yamagishi | |
| 4,990,994 A | 2/1991 | Furukawa et al. | |
| 5,003,372 A | 3/1991 | Kim et al. | |
| 5,047,833 A | 9/1991 | Gould | |
| 5,113,237 A | 5/1992 | Stengl | |
| 5,233,215 A | 8/1993 | Baliga | |
| 5,323,040 A | 6/1994 | Baliga | |

(Continued)

FOREIGN PATENT DOCUMENTS

| | | |
|---|---|---|
| DE | 19840032 | 11/1999 |
| EP | 0604194 | 6/1994 |

(Continued)

OTHER PUBLICATIONS

International Search Report for PCT/US05/38118 dated Feb. 6, 2007.

*Primary Examiner* — Bilkis Jahan

(57) ABSTRACT

A SiC JFET that includes a plurality of trenches formed in a SiC semiconductor body of one conductivity each trench having a region of another conductivity formed in the bottom and sidewalls thereof.

20 Claims, 2 Drawing Sheets

(56) References Cited

U.S. PATENT DOCUMENTS

| | | | |
|---|---|---|---|
| 5,362,975 A | 11/1994 | von Windheim et al. | |
| 5,384,470 A | 1/1995 | Tachibana et al. | |
| 5,527,745 A | 6/1996 | Dixit et al. | |
| 5,689,128 A | 11/1997 | Hshieh et al. | |
| 5,712,502 A | 1/1998 | Mitlehner et al. | |
| 5,747,831 A * | 5/1998 | Loose et al. | 257/77 |
| 5,753,938 A * | 5/1998 | Thapar | H01L 29/7722 |
| | | | 257/136 |
| 5,789,311 A | 8/1998 | Ueno et al. | |
| 5,801,836 A | 9/1998 | Bakowski et al. | |
| 5,914,500 A | 6/1999 | Bakowski et al. | |
| 5,915,179 A | 6/1999 | Etou et al. | |
| 5,932,894 A | 8/1999 | Bakowski et al. | |
| 5,977,605 A | 11/1999 | Bakowsky et al. | |
| 6,040,237 A | 3/2000 | Bakowski et al. | |
| 6,040,600 A | 3/2000 | Uenishi et al. | |
| 6,040,617 A | 3/2000 | Patel | |
| 6,100,572 A | 8/2000 | Kinzer | |
| 6,150,246 A | 11/2000 | Parsons | |
| 6,177,712 B1 | 1/2001 | Miyasaka | |
| 6,207,591 B1 | 3/2001 | Aoki et al. | |
| 6,229,194 B1 | 5/2001 | Lizotte | |
| 6,303,986 B1 | 10/2001 | Shook | |
| 6,320,205 B1 | 11/2001 | Pfirsch et al. | |
| 6,353,252 B1 | 3/2002 | Yasuhara et al. | |
| 6,362,495 B1 | 3/2002 | Schoen et al. | |
| 6,373,076 B1 | 4/2002 | Alok et al. | |
| 6,410,958 B1 | 6/2002 | Usui et al. | |
| 6,432,750 B2 | 8/2002 | Jeon et al. | |
| 6,441,455 B1 | 8/2002 | Dutta | |
| 6,498,368 B2 | 12/2002 | Sakamoto et al. | |
| 6,509,240 B2 | 1/2003 | Ren et al. | |
| 6,514,782 B1 | 2/2003 | Wierer, Jr. et al. | |
| 6,562,647 B2 * | 5/2003 | Zandman et al. | 438/33 |
| 6,573,534 B1 | 6/2003 | Kumar et al. | |
| 6,573,537 B1 | 6/2003 | Steigerwald et al. | |
| 6,586,801 B2 | 7/2003 | Onishi et al. | |
| 6,605,862 B2 | 8/2003 | Van Dalen et al. | |
| 6,621,122 B2 | 9/2003 | Qu | |
| 6,622,380 B1 | 9/2003 | Grigg | |
| 6,624,522 B2 | 9/2003 | Standing et al. | |
| 6,630,698 B1 | 10/2003 | Deboy et al. | |
| 6,635,944 B2 | 10/2003 | Stoisiek | |
| 6,673,662 B2 | 1/2004 | Singh | |
| 6,674,126 B2 | 1/2004 | Iwamoto et al. | |
| 6,683,347 B1 | 1/2004 | Fujihira | |
| 6,700,141 B2 | 3/2004 | Iwamoto et al. | |
| 6,713,813 B2 | 3/2004 | Marchant | |
| 6,740,931 B2 | 5/2004 | Kouzuki et al. | |
| 6,762,455 B2 | 7/2004 | Oppermann et al. | |
| 6,764,906 B2 | 7/2004 | Darwish | |
| 6,768,170 B2 | 7/2004 | Zhou | |
| 6,791,167 B2 | 9/2004 | Hayashi et al. | |
| 6,812,282 B2 | 11/2004 | Chang et al. | |
| 6,828,609 B2 | 12/2004 | Deboy et al. | |
| 6,844,571 B2 | 1/2005 | Krames et al. | |
| 6,849,900 B2 | 2/2005 | Aida et al. | |
| 6,897,133 B2 | 5/2005 | Collard | |
| 6,936,850 B2 | 8/2005 | Friedrichs et al. | |
| 6,949,454 B2 | 9/2005 | Swanson et al. | |
| 6,960,829 B2 | 11/2005 | Hogerl | |
| 6,979,862 B2 | 12/2005 | Henson | |
| 6,992,340 B2 | 1/2006 | Tanaka | |
| 7,034,376 B2 | 4/2006 | Okada et al. | |
| 7,073,890 B2 | 7/2006 | Cabal et al. | |
| 7,166,890 B2 | 1/2007 | Sridevan | |
| 7,173,284 B2 | 2/2007 | Kumar et al. | |
| 7,262,434 B2 | 8/2007 | Okamura et al. | |
| 7,265,045 B2 | 9/2007 | Lee et al. | |
| 7,265,388 B2 | 9/2007 | Fukuda et al. | |
| 7,299,538 B2 | 11/2007 | Tactic-Lucic | |
| 7,315,081 B2 | 1/2008 | Standing | |
| 7,394,158 B2 | 7/2008 | Carta et al. | |
| 7,411,218 B2 | 8/2008 | Seng et al. | |
| 7,492,003 B2 | 2/2009 | Kinzer | |
| 7,507,650 B2 | 3/2009 | Nakamura et al. | |
| 7,649,213 B2 | 1/2010 | Hatakeyama et al. | |
| 7,687,907 B2 | 3/2010 | Okuda et al. | |
| 7,718,470 B2 | 5/2010 | Hsu | |
| 7,834,376 B2 * | 11/2010 | Carta et al. | 257/134 |
| 8,368,165 B2 | 2/2013 | Richieri | |
| 8,368,211 B2 | 2/2013 | Standing et al. | |
| 8,368,223 B2 | 2/2013 | Standing | |
| 2001/0043172 A1 | 11/2001 | McGrath et al. | |
| 2001/0052601 A1 | 12/2001 | Onishi et al. | |
| 2002/0063281 A1 | 5/2002 | Tihanyl | |
| 2002/0064930 A1 | 5/2002 | Ishikawa | |
| 2002/0076851 A1 | 6/2002 | Eden et al. | |
| 2002/0109211 A1 | 8/2002 | Shinohara | |
| 2002/0171087 A1 | 11/2002 | Krames et al. | |
| 2002/0179909 A1 | 12/2002 | Uchida et al. | |
| 2003/0006425 A1 | 1/2003 | Bol et al. | |
| 2003/0042538 A1 | 3/2003 | Kumar et al. | |
| 2003/0075783 A1 | 4/2003 | Yoshihara et al. | |
| 2003/0127747 A1 | 7/2003 | Kajiwara et al. | |
| 2003/0162355 A1 | 8/2003 | Sankin et al. | |
| 2003/0176031 A1 | 9/2003 | Onishi et al. | |
| 2003/0183895 A1 | 10/2003 | Okamura et al. | |
| 2004/0012930 A1 | 1/2004 | Grigg | |
| 2004/0051118 A1 | 3/2004 | Bruhns et al. | |
| 2004/0063240 A1 | 4/2004 | Madrid et al. | |
| 2004/0070060 A1 | 4/2004 | Mamitsu et al. | |
| 2004/0104489 A1 | 6/2004 | Larking | |
| 2004/0110330 A1 | 6/2004 | Collard | |
| 2004/0113264 A1 | 6/2004 | Akerling et al. | |
| 2004/0135178 A1 | 7/2004 | Onose et al. | |
| 2004/0145380 A1 | 7/2004 | Babcock et al. | |
| 2004/0150040 A1 | 8/2004 | Nitta et al. | |
| 2004/0169262 A1 | 9/2004 | Oliver et al. | |
| 2004/0207092 A1 | 10/2004 | Burrell et al. | |
| 2004/0212011 A1 * | 10/2004 | Ryu | 257/335 |
| 2004/0212093 A1 | 10/2004 | Chopra et al. | |
| 2004/0245570 A1 | 12/2004 | Ninomiya | |
| 2004/0262685 A1 | 12/2004 | Zingg | |
| 2005/0012143 A1 * | 1/2005 | Tanaka et al. | 257/328 |
| 2005/0023680 A1 | 2/2005 | Wang et al. | |
| 2005/0029557 A1 | 2/2005 | Hatakeyama et al. | |
| 2005/0034888 A1 | 2/2005 | Hoffmann et al. | |
| 2005/0067630 A1 * | 3/2005 | Zhao | 257/134 |
| 2005/0072984 A1 | 4/2005 | Kwak et al. | |
| 2005/0077615 A1 | 4/2005 | Yu et al. | |
| 2005/0082570 A1 | 4/2005 | Sridevan | |
| 2005/0082611 A1 | 4/2005 | Peake et al. | |
| 2005/0091988 A1 | 5/2005 | Stewart et al. | |
| 2005/0139947 A1 | 6/2005 | Okada et al. | |
| 2005/0181536 A1 * | 8/2005 | Tsuji | H01L 21/0445 |
| | | | 438/105 |
| 2005/0200011 A1 | 9/2005 | Standing et al. | |
| 2005/0230715 A1 * | 10/2005 | Hoshino et al. | 257/263 |
| 2005/0253168 A1 | 11/2005 | Wu et al. | |
| 2006/0003514 A1 | 1/2006 | Richieri | |
| 2006/0086939 A1 | 4/2006 | Carta et al. | |
| 2006/0145283 A1 | 7/2006 | Zhu et al. | |
| 2006/0214242 A1 | 9/2006 | Carta et al. | |
| 2006/0220027 A1 | 10/2006 | Takahashi et al. | |
| 2006/0226504 A1 | 10/2006 | Hatakeyama et al. | |
| 2006/0255423 A1 | 11/2006 | Ryu et al. | |
| 2007/0222025 A1 | 9/2007 | Husain et al. | |
| 2007/0228505 A1 | 10/2007 | Mazzola et al. | |
| 2008/0237608 A1 | 10/2008 | Richieri | |
| 2008/0286968 A1 | 11/2008 | Carta et al. | |
| 2009/0067630 A1 | 3/2009 | Daemen et al. | |
| 2009/0104738 A1 | 4/2009 | Ring et al. | |
| 2010/0068855 A1 | 3/2010 | Saxler et al. | |
| 2011/0278591 A1 | 11/2011 | Carta et al. | |
| 2014/0042459 A1 | 2/2014 | Richieri | |

FOREIGN PATENT DOCUMENTS

| | | |
|---|---|---|
| EP | 0681326 A2 | 11/1995 |
| EP | 0958923 A2 | 11/1999 |
| EP | 1349202 | 1/2003 |
| EP | 1739753 | 3/2004 |
| FR | 2579023 | 9/1986 |

(56) References Cited

FOREIGN PATENT DOCUMENTS

| | | |
|---|---|---|
| JP | 1187690 | 7/1989 |
| JP | 1187698 | 7/1989 |
| JP | 7302896 | 11/1995 |
| JP | 09-036393 | 2/1997 |
| JP | 11348355 | 12/1999 |
| JP | 2000-022178 | 1/2000 |
| JP | 2001313391 | 11/2001 |
| JP | 2003258271 | 3/2002 |
| JP | 2002-118268 | 4/2002 |
| JP | 2002158363 | 5/2002 |
| JP | 2002261295 | 9/2002 |
| JP | 2003074951 | 3/2003 |
| JP | 2003273127 | 9/2003 |
| JP | 2004079988 | 3/2004 |
| JP | 2004-111759 | 4/2004 |
| JP | 2004099898 | 4/2004 |
| JP | 2004221513 | 8/2004 |
| JP | 2005079339 | 3/2005 |
| JP | 2005286197 | 10/2005 |
| JP | 2005311347 | 11/2005 |
| JP | 2006-100593 | 4/2006 |
| WO | 0038242 | 6/2000 |
| WO | 0143172 | 6/2001 |
| WO | 03038906 | 5/2003 |
| WO | 2005093840 | 3/2004 |
| WO | 2005091988 | 10/2005 |
| WO | 2006047382 | 5/2006 |
| WO | 2006074382 | 7/2006 |

\* cited by examiner

POWER SEMICONDUCTOR SWITCH WITH PLURALITY OF TRENCHES

CROSS REFERENCE TO RELATED APPLICATIONS

This application is a Continuation of U.S. patent application No. 11/368,979 filed Mar. 6, 2006, now U.S. Pat. No. 7,834,376, entitled "Power Semiconductor Switch", by Rossano Carta et al., which claims the benefit of U.S. Provisional Patent Application No. 60/658,565 filed Mar. 4, 2005, entitled "SiC Vertical JFET Design And Method For Fabrication", by Rossano Carta et al., which are hereby incorporated by reference.

BACKGROUND

The present invention relates to power semiconductor devices and more particularly to SiC (silicon carbide)-based JFETs.

Silicon has long been the dominant semiconductor of choice for high-voltage power electronics applications. Recently, SiC has gained the attention of designers due in large part to its wide band gap which promises much better performance than silicon particularly in high voltage applications.

SiC rectifiers, for example, high voltage Schottky diodes, are known. Diodes, however, exhibit high resistance and thus are deemed inefficient. For better efficiency, it is desirable to have a SiC based switch.

For example, for 300V-1200V applications a unipolar switch is most desirable. A MOSFET is an example of a unipolar switch. MOSFETs, however, may have reliability problems when operating at high temperatures and with high electric fields, as well as low channel mobility. These adverse characteristics may be due to the poor quality of the gate oxide.

SUMMARY

A power device according to the present invention is a SiC-based JFET. Advantageously, a SiC JFET transistor, being free of a gate oxide, is an excellent device for high temperature and high power switching applications.

A power semiconductor device according to the present invention includes a SiC body of one conductivity formed over a SiC substrate of the one conductivity, the semiconductor body including an active region having a plurality of spaced trenches each adjacent a mesa and each including a region of another conductivity formed into the sidewalls and the bottom thereof, each region of the another conductivity being deep enough so that each mesa includes a first portion of the one conductivity between two opposing regions of the another conductivity, a contact region of the one conductivity having a lower electrical resistivity than the semiconductor body formed atop each mesa, a conductive gate electrode formed adjacent and in contact with the sidewalls and the bottom of each trench, an insulation cap formed over each conductive gate electrode, a first power contact in ohmic contact with the contact regions, a second power contact in ohmic contact with the substrate.

Preferably, the conductive gate electrode comprises a polysilicon of the same conductivity as the regions of another conductivity, and each insulation cap resides within a respective trench and is substantially coplanar with the top surface of an adjacent mesa. In an embodiment, the conductive gate electrode comprises a polycrystalline semiconductor material of the another conductivity.

The present invention also relates to the design and process of fabricating a vertical JFET, which can work normally-on or normally-off, depending on the single cell geometries selected. Some of the innovative steps in the process are:

Hard mask definition (Al+SiO2 layer) to correctly etch the trenches;

Multiple implant at different angles, for distributing the P doping everywhere along the trench;

Doping activation using a novel Rapid Thermal Annealing step;

Gate and source contact planarization by filling the trench with highly P doped polysilicon.

In a device according to the present invention, the blocking capability is created by fully depleting the channel region within the mesas with a negative bias between the gate and the source (Vgs<0). A channel region is that portion of each mesa which is of the same conductivity as the semiconductor body. The capability to block a certain voltage (600V or more) is defined by the choice of the thickness of the SiC semiconductor body and its resistivity. The device will conduct when a positive bias between the gate and the source is applied (Vgs>0) and the width of the channel region (Wch) is large enough for the vertical conduction current flow.

In a normally off device according to the present invention, blocking may be assured by pinching the channel region at a gate to source voltage equal to or lower than zero volts. The voltage necessary to cause the pinching can be determined by selecting the proper channel width, which depends on the resistivity and the depth of the regions of another conductivity, as well as the thickness of the mesas.

Other features and advantages of the present invention will become apparent from the following description of the invention which refers to the accompanying drawings.

DETAILED DESCRIPTION

Figure 1:
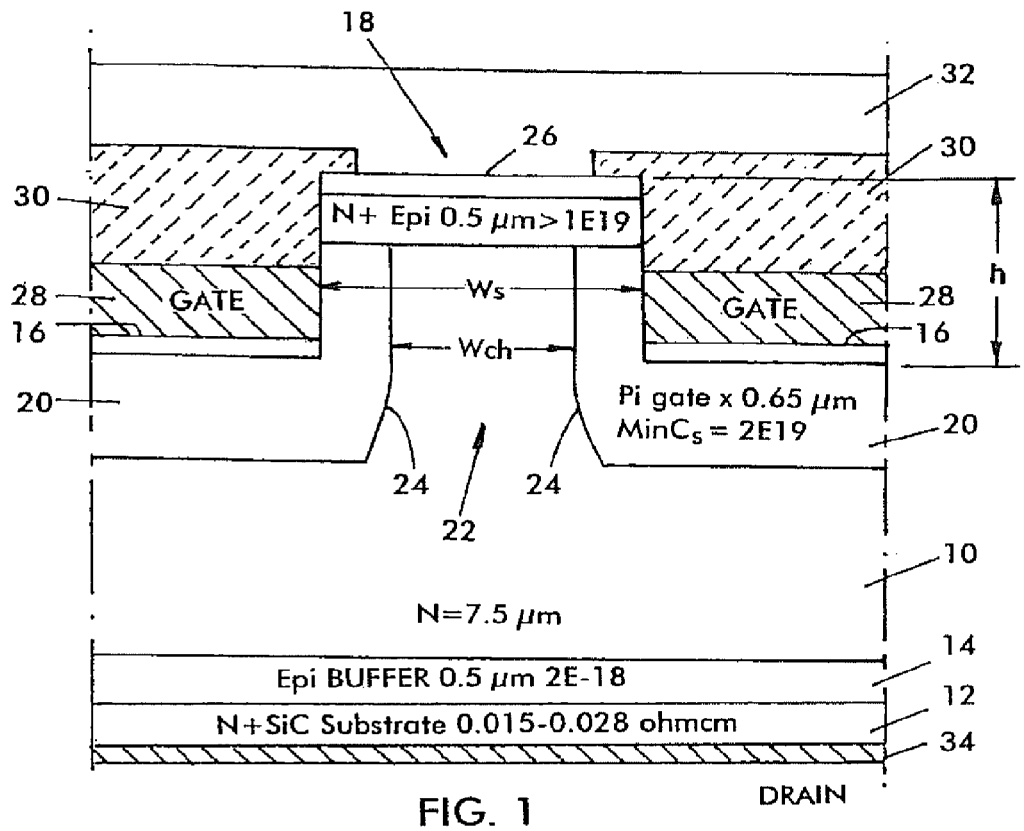
FIG. 1 shows a cross-sectional view of a portion of the active region of a device according to the preferred embodiment of the invention.

Referring to FIG. 1, a power semiconductor device according to the present invention is a JFET that includes a SiC (silicon carbide) semiconductor body 10 of one conductivity (e.g. N-type) formed over a SiC substrate 12 of the same conductivity. Note that in the preferred embodiment a SiC buffer layer 14 of one conductivity is interposed between semiconductor body 10 and substrate 12. Semiconductor body 10 includes a plurality of spaced trenches 16 each adjacent a mesa 18 and each including a region 20 of another conductivity (e.g. P-type) formed in the bottom and sidewalls thereof. Each region 20 is deep enough so that each mesa 18 includes a first portion 22 of the one conductivity and two opposing regions 24 of another conductivity. Each mesa 18 further includes a contact region 26 of the one conductivity having a lower electrical resistivity than semiconductor body 10. Formed in each trench is a conductive gate electrode 28 which is adjacent to and in direct contact with the sidewalls and bottom of the trench in which it resides. An insulation cap 30 is formed over each gate electrode 28 in order to insulate the same from first power contact 32 (referred to as source contact), which is in ohmic contact with contact region 26. A device according to the present invention further includes a second power contact 34 (referred to as drain contact) in ohmic contact with substrate 12.

Substrate 12 is preferably wafer quality SiC, buffer layer 14, semiconductor body 10 and contact region 26 are all epitaxially formed SiC. Gate electrodes 28 are preferably polysilicon bodies of the same conductivity as regions 20 (e.g. P-type), while insulation plugs 30 are preferably formed with a low density, low temperature silicon dioxide such as TEOS (tetraethyl orthosilicate). In addition, first power contact 32 and second power contact 34 may be formed with aluminum or the like material, and optionally rendered solderable.

Referring next to FIGS. 2A-2D, in order to fabricate a device according to the present invention, starting with a semiconductor structure which includes substrate 12, buffer 14, semiconductor body 10 and contact region 26, first, a portion of contact region 26 is removed from termination region 36, and then SiC in termination region 36 is etched. Next, according to an aspect of the present invention a hard mask body including a silicon dioxide layer 38, and aluminum 40 is deposited. Thereafter, a photoimageable mask 42 is disposed over the hard mask body and patterned to define the areas that are to be trenched. Next, the hard mask body is patterned through the photoimageable mask 40 resulting in the structure seen in FIG. 2A. The openings in the hard mask body designate the areas for trench formation in semiconductor body 10. The broken lines define the boundaries of trenches.

After the hard mask formation, trenches 16 in active region 37, and first trench 42, and second trenches 44 are formed through dry etching. Note that first trench 42 and second trenches 44 surround active region 37. Note that first trench 42 is wider than either of second trenches 44. Also, note that the sidewalls of trenches 16 can be angled to be 87° or higher. Next, dopants of a conductivity opposite to that of semiconductor body 10 are implanted into the sidewalls and the bottom of trenches 16 in active region 37 and first trench 42 and second trenches 44. Note that the dopants may be implanted at 90° angle toward the bottom of trenches 16, 42, 44, and at other angles relative to the bottom toward the sidewalls thereof. Thereafter, the hard mask is removed, and a rapid thermal anneal step is carried out preferably at about 1650° C. for about twenty minutes to form regions of another conductivity 20 in the sidewalls and the bottom of trenches 16, 42, 44 resulting in the structure shown in FIG. 2B.

Figure 2A:
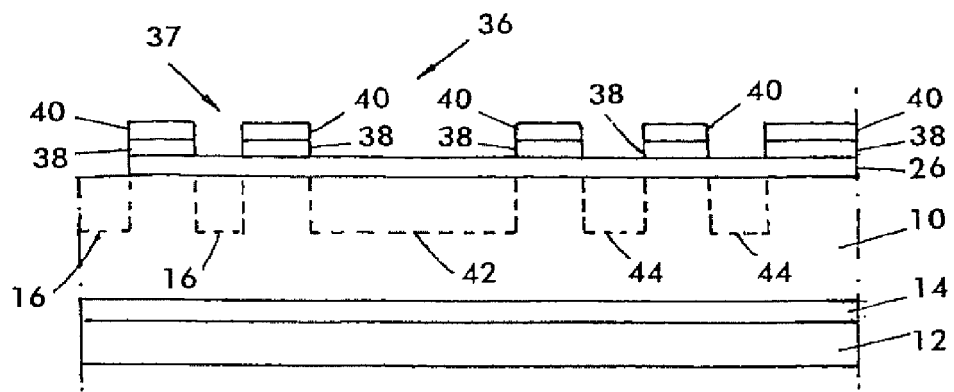
FIGS. 2A-2D illustrate a process for fabricating a device according to the invention.
Figure 2B:
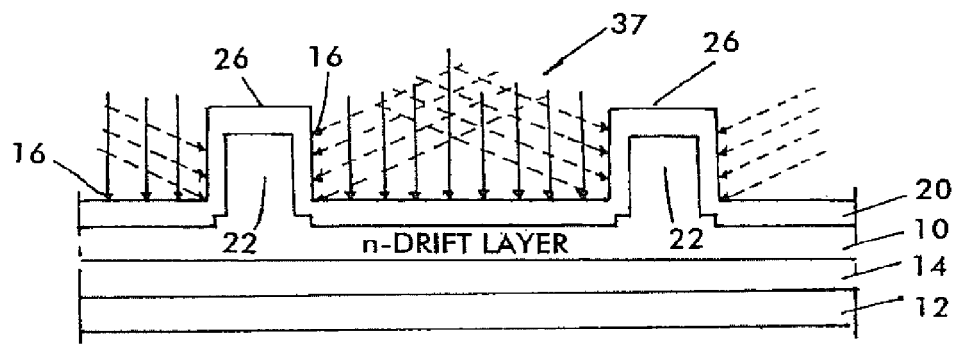
Figure 2C:
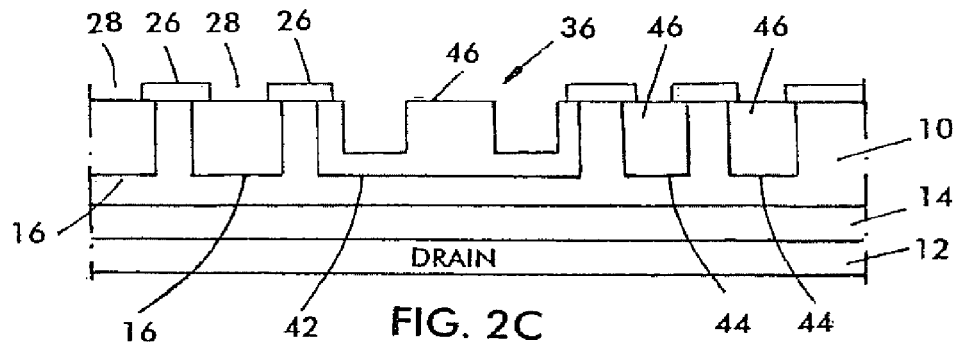

Next, polysilicon is deposited in trenches 16, 42, 44. The polysilicon may be rendered conductive to have the same conductivity as regions 20 by dopant implantation (e.g. boron or aluminum) after deposition or by in situ doping while the polysilicon is being deposited. The polysilicon is then patterned by masking and etching (by plasma etching or the like) leaving gate electrodes 28 in trenches 16, and conductive electrodes 46 in trenches 42, 44 in termination region 36, as seen in FIG. 2C.

Figure 2D:
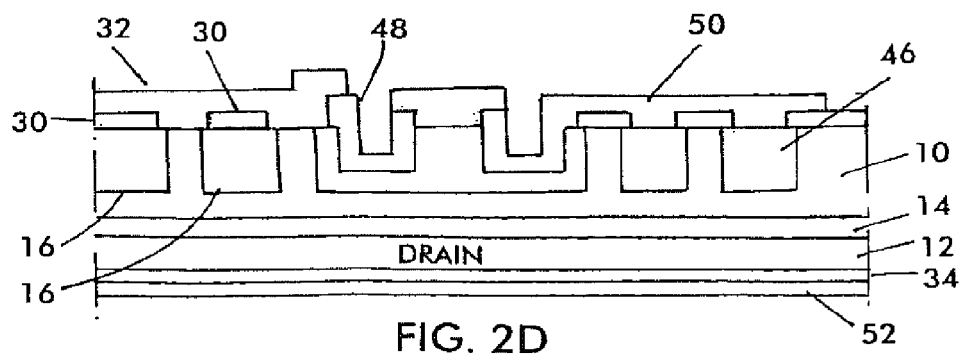

Next, as seen in FIG. 2D, a low temperature, low density field oxide such as TEOS is deposited, masked, and etched to form insulation plugs 30 over gate electrodes 28, an insulation body 48 between electrode 42 and a sidewall of trench 42, and a field insulation body 50 having a portion between electrode 46 and a sidewall of trench 42 extending over trenches 44 and the mesas therebetween. Note, also that the oxide may be patterned also for the gate and gate finger connection to gate electrodes, as well as source contact connection to contact regions 26.

Next, source metal is deposited and patterned to form first power contact 32 as seen in FIG. 2D. Note that a process according to the present invention results in a surface that is relatively flat before source metal is deposited. As a result, the source metal coverage is excellent. Optionally, the top side (also referred to as front side) of the device can be then passivated with polyimide or the like and patterned to provide access to power contact 32 and the gate contact (not shown). Thereafter, a back metal is deposited on substrate 12 to form second power contact. Preferably, a tri-metal solderable stack 52 (e.g. Ti—Ni—Ag (titanium-nickel-silver)) is formed over second power electrode 34.

Figure 3:
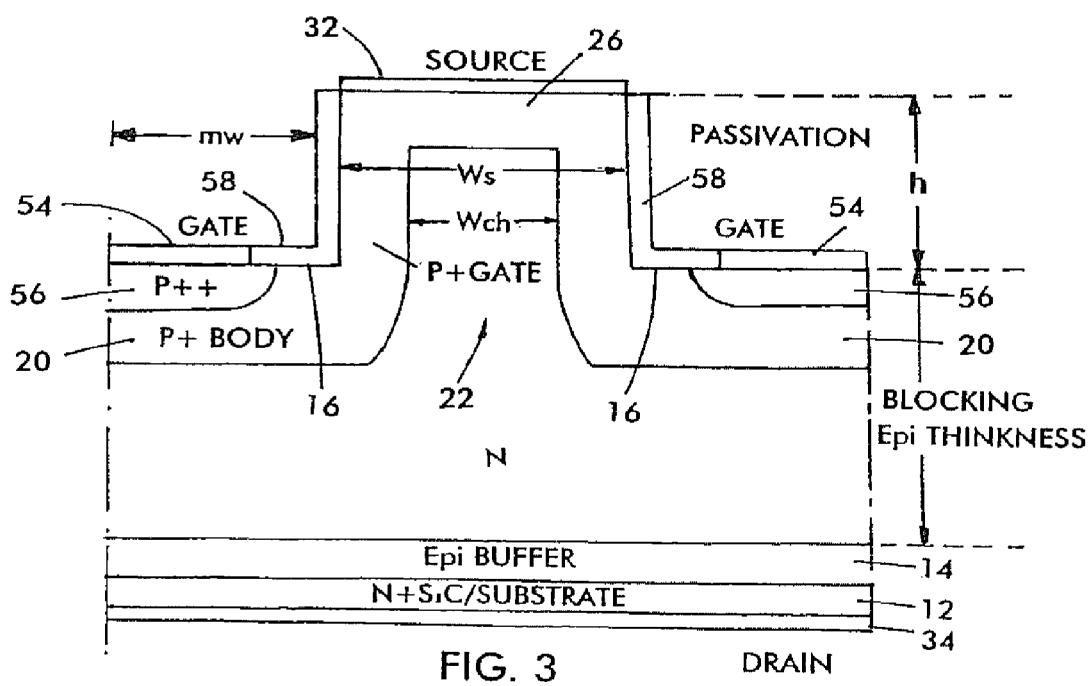
FIG. 3 shows a cross-sectional view of a portion of the active region of a device according to another embodiment of the invention.

Referring to FIG. 3, (in which like numerals identify like features present in the previously discussed embodiment) in an alternative embodiment, the polysilicon gate is replaced with a metal gate 54, which is electrically connected to a highly conductive contact region 56 of the same conductivity as region 20 at the bottom of each trench 16. The sidewalls of the trench are then passivated with a passivation body 58, such as silicon dioxide.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A power semiconductor device comprising:
   a silicon carbide (SiC) semiconductor body of one conductivity formed above a SiC substrate of said one conductivity, said SiC semiconductor body comprising an active region including a plurality of spaced trenches each adjacent a mesa and each trench comprising a region of another conductivity formed into its sidewalls and bottom thereof, each region of said another conductivity being deep enough so that said mesa comprises a first portion of said one conductivity between two opposing regions of said another conductivity;
   a contact region of said one conductivity comprising a lower electrical resistivity than said SiC semiconductor body formed above said mesa, said contact region comprises SiC;
   a conductive gate electrode formed adjacent to and in contact with said sidewalls and said bottom of each trench, said mesa is free of said conductive gate electrode, said conductive gate electrode directly contacts with said region of another conductivity;
   an insulation cap formed above said conductive gate electrode, said insulation cap covers a top surface portion of said contact region, said insulation cap directly contacts with said contact region, said insulation cap has direct contact with a sidewall of said region of another conductivity;
   a first power contact in ohmic contact with said contact region; and
   a second power contact in ohmic contact with said SiC substrate, said second power contact comprises solderable material,
   wherein said power semiconductor device is a junction field effect transistor.

2. The power semiconductor device of claim 1, wherein said SiC semiconductor body comprises epitaxially formed SiC.

3. The power semiconductor device of claim 1, further comprising a termination region, said termination region comprises a plurality of trenches that surround said active region, each of said plurality of trenches of said termination region comprises a conductive electrode.

4. The power semiconductor device of claim 1, wherein said conductive gate electrode comprises a polysilicon of said another conductivity.

5. The power semiconductor device of claim 1, wherein said insulation cap comprises an oxide.

6. The power semiconductor device of claim 1, wherein said insulation cap comprises silicon doxide.

7. The power semiconductor device of claim 1, further comprising a termination region that surrounds said active region.

8. The power semiconductor device of claim 7, wherein said termination region comprises a trench having a region of said another conductivity formed into sidewalls and bottom thereof.

9. The power semiconductor device of claim 1, wherein said first power contact is a source contact.

10. The power semiconductor device of claim 1, wherein said second power contact is a drain contact.

11. The power semiconductor device of claim 1, further comprising a termination region, said termination region comprises a plurality of trenches that surround said active region, each of said plurality of trenches of said termination region comprises a conductive electrode.

12. A power semiconductor device comprising:
a buffer layer formed above a silicon carbide (SiC) substrate of one conductivity;
a SiC semiconductor body of said one conductivity formed above said buffer layer, said SiC semiconductor body and said SiC substrate have the same conductivity, said SiC semiconductor body comprising an active region including a plurality of spaced trenches each adjacent a mesa and each trench comprising a region of another conductivity formed into its sidewalls and bottom thereof, each region of said another conductivity being deep enough so that said mesa comprises a first portion of said one conductivity between two opposing regions of said another conductivity;
a contact region of said one conductivity comprising a lower electrical resistivity than said SIC semiconductor body formed above said mesa;
a conductive gate electrode formed adjacent to and in contact with said sidewalls and said bottom of each trench, said mesa is free of said conductive gate electrode, said conductive gate electrode directly contacts with said region of another conductivity;
an insulation cap formed above said conductive gate electrode, said insulation cap covers a top surface portion of said contact region, said insulation cap directly contacts with said contact region, said insulation cap has direct contact with a sidewall of said region of another conductivity;
a first power contact in ohmic contact with said contact region; and
a second power contact in ohmic contact with said SiC substrate, said second power contact comprises solderable material,
wherein said power semiconductor device is a junction field effect transistor.

13. The power semiconductor device of claim 12, wherein said buffer layer comprises epitaxially formed SiC.

14. The power semiconductor device of claim 12, wherein said SiC semiconductor body comprises epitaxially formed SiC.

15. The power semiconductor device of claim 12, wherein said contact region comprises epitaxially formed SiC.

16. The power semiconductor device of claim 11, wherein each of said plurality of trenches of said termination region comprises a region of said another conductivity formed into its sidewalls and bottom thereof.

17. The power semiconductor device of claim 12, further comprising a termination region that surrounds said active region, said termination region comprises a plurality of trenches, each of said plurality of trenches of said termination region comprises a region of said another conductivity formed into its sidewalls and bottom thereof.

18. The power semiconductor device of claim 12, wherein said insulation cap comprises an oxide.

19. The power semiconductor device of claim 12, wherein said first power contact comprises solderable material.

20. The power semiconductor device of claim 12, further comprising a termination region that surrounds said active region, said termination region comprises a first trench and a second trench, said first trench is wider than said second trench.

* * * * *